United States Patent [19]

Akira et al.

[11] Patent Number: 4,624,859
[45] Date of Patent: Nov. 25, 1986

[54] METHOD OF PRODUCING SILICON DIOXIDE FILMS

[75] Inventors: Shuhara Akira; Yamanishi Kenichiro; Minowa Yoshibumi, all of Amagasaki, Japan

[73] Assignee: Mitsubishi Denki Kabushiki Kaisha, Tokyo, Japan

[21] Appl. No.: 758,223

[22] PCT Filed: May 28, 1985

[86] PCT No.: PCT/JP84/00274

§ 371 Date: Jul. 10, 1985

§ 102(e) Date: Jul. 10, 1985

[51] Int. Cl.$^4$ ................... B05D 3/06; B05D 5/12
[52] U.S. Cl. ............................... 427/38; 204/164; 427/39; 427/294; 427/93; 427/255
[58] Field of Search ................ 204/164; 427/38, 39, 427/93, 294, 255

[56] References Cited

U.S. PATENT DOCUMENTS 4,004,176  1/1977  Otake et al. ............... 427/38 X
4,440,804  4/1984  Milgram .................... 427/38 XX
4,492,717  1/1985  Pliskin et al. .............. 427/93 X

OTHER PUBLICATIONS

Minowa, Y. et al., *SiO$_2$ Films Deposited on Si by an Ionized Cluster Beam*, Journal of Vacuum Science & Technology B, Second Series, vol. 1, No. 4, Oct.-Dec. 1983, pp. 1148–1151.

*Primary Examiner*—Michael R. Lusignan
*Attorney, Agent, or Firm*—Birch, Stewart, Kolasch & Birch

[57] ABSTRACT

A method of producing silicon dioxide films for use as insulating films in semiconductor elements, wherein the composition proportion of silicon and oxygen atoms and the bond thereof are satisfactory so that no pinholes are present, and a film of high density is obtained. The method includes heating a material of silicon or silicon oxides 11 thereby to vaporize the same in a gas ambient consisting mainly of oxygen atoms in a vacuum container 18; ionizing or exciting the vaporized material; and accelerating the ionized material so as to collide with the surface of a substrate 17, thereby producing a silicon dioxide film on the substrate 17.

27 Claims, 7 Drawing Figures

METHOD OF PRODUCING SILICON DIOXIDE FILMS

FIELD OF THE INVENTION

This invention relates to a method of producing silicon dioxide films on a substrate, wherein the resulting film is suitable for use as an insulating film for semiconductor elements.

DESCRIPTION OF THE PRIOR ART

Conventionally, the sputtering method is known in the art to produce silicon dioxide films, and to carry it out the equipment shown in FIG. 1 is employed. In FIG. 1 there are provided a vacuum container 1, electrodes 2 and 3, the electrode 2 being positive and the electrode 3 being negative, a gas inlet 4, a substrate 6 fixed to the surface of the positive electrode 2, and a target 5 fixed to the negative electrode 3 opposite to the substrate 6. The reference numerals 7 and 8 designate an argon gas container and a valve connected to a discharge duct communicating with a vacuum pump (not shown), respectively. The reference numeral 9 designates insulating pillars.

By employing the equipment described above, the known method is carried out as follows:

An argon gas is introduced into the vacuum container 1 through the gas inlet 4, and an electric field is applied between the electrodes 2, 3, whereby the argon gas is ionized into $Ar^+$ ions. The argon ions collide with the target 5 of silicon dioxide on the negative electrode 3, thereby enabling the molecules of silicon dioxide to dissipate in the vacuum container 1. The dissipating silicon dioxide molecules stick to the surface of the substrate 6 on the positive electrode 2. In this way silicon dioxide films are deposited on the substrate 6.

The known method has the following drawbacks. First of all, it is impossible to form a silicon dioxide film having a perfect composition, proportion and bonding of atoms as a compound, and the films generally lack in oxygen atoms. Second, the films are likely to have pinholes due to the intrusion of the argon gas into the silicon dioxide film. Third, the density is likely to be low, which prohibits the films for use in semiconductor elements where high reliability and high quality are required for the silicon dioxide films. In order to obviate the possibility of oxygen-short films, there is a proposal for heating the substrate 5° to 800° C. or more so as to accelerate oxidizing. However, after an aluminium wiring is produced on the substrate in a semiconductor process using a semiconductor for the substrate 5, the aluminium wiring is likely to melt away at such an elevated temperature.

DISCLOSURE OF THE INVENTION

The present invention provides a method of producing silicon dioxide films, which comprises a first step of heating a material of silicon or silicon oxides thereby to vaporize the same; a second step of ionizing or exciting the vaporized material; and a third step of accelerating the ionized material thereby to enable the same to collide with the substrate, wherein these three steps are carried out in a vacuum container which includes a gas ambient consisting mainly of oxygen atoms, thereby enabling silicon dioxide to be vapor-plated on the substrate to produce a high quality silicon dioxide film.

Under the present invention the vaporized silicon or its oxides is at least partially ionized or excited, and accelerated, thereby ensuring that the silicon atoms are sufficiently activated to be combined while vapor-plating or flying onto the substrate with the oxygen molecules or atoms in the ambient which are also partially ionized or excited. Accordingly, it is not necessary to heat the substrate up to an elevated temperature, which is commonly practiced under the conventional sputtering method, and there is no likelihood of oxygen shortage. The invention uses no argon gas, thereby ensuring pinhole-free, high purity, high density, and high-pressure resistant silicon dioxide films. The method of the invention has many practical advantages as a method for producing an insulating film in semiconductor elements.

BEST MODE FOR CARRYING OUT THE INVENTION

The inventors have made every effort to solve the above-described problems, and studied various ways about how to produce high density silicon dioxide films rich in oxygen. One of the methods investigated by them is that which comprises heating silicon or its oxides to vaporize the same in an ambient consisting mainly of oxygen atoms, ionizing the vaporized material, and accelerating the ionized vapor so as to be vapor-plated on the substrate.

Full and comprehensive experiments have been conducted as to the partial gas pressure in a gas ambient consisting mainly of oxygen atoms, the vapor-plating rate, and other factors. As a result, it has been found that the selection of a suitable partial gas pressure and vapor-plating rate is essential for producing high quality silicon dioxide films.

One embodiment of the present invention will be more particularly described with reference to the drawings.

Figure 1:
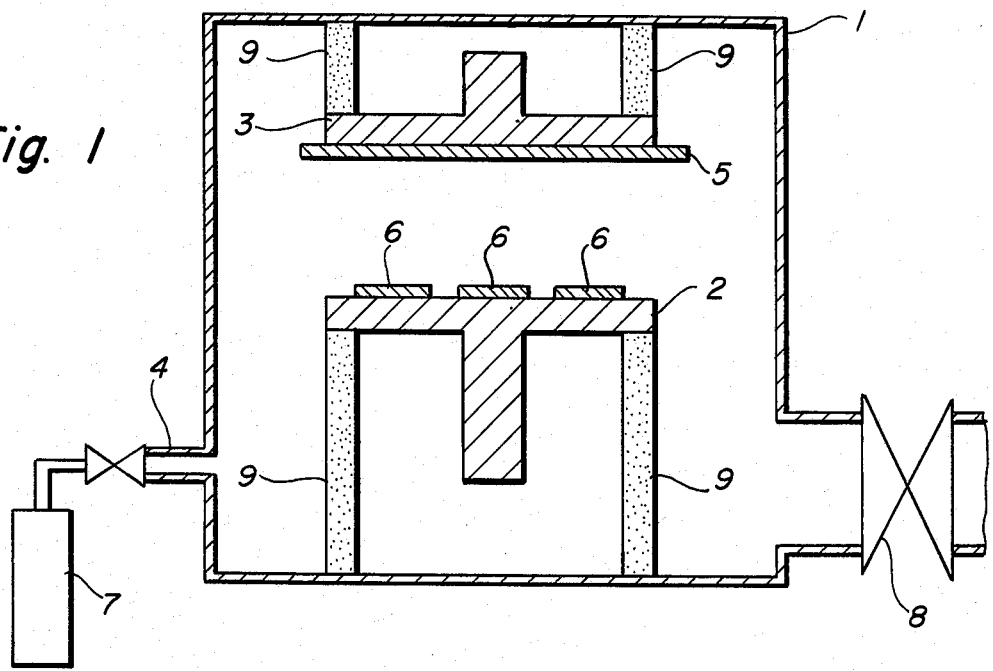
FIG. 1 is a schematic cross-sectional view showing the equipment used for carrying out the conventional method of producing silicon dioxide films.
Figure 2:
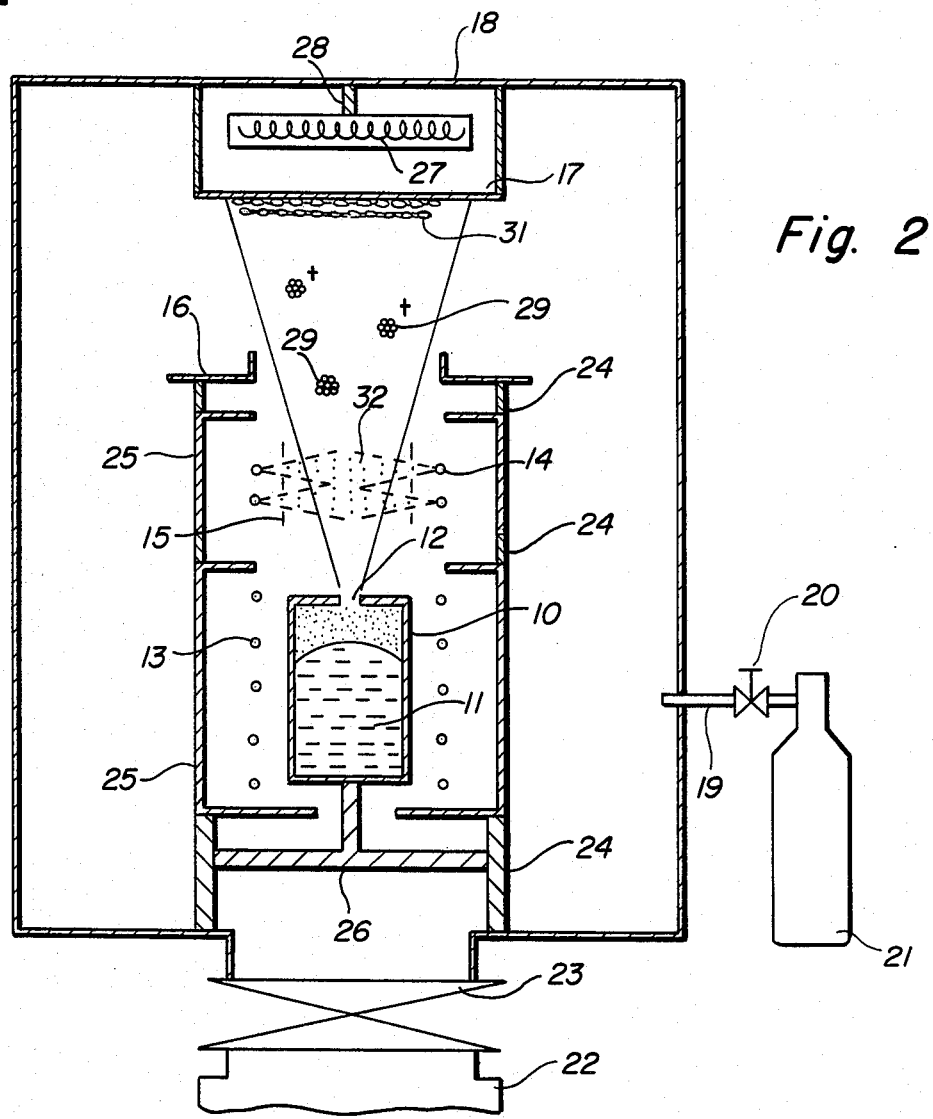
FIG. 2 is a schematic cross-sectional view showing equipment for use in carrying out a method of an embodiment of the present invention.
Figure 3:
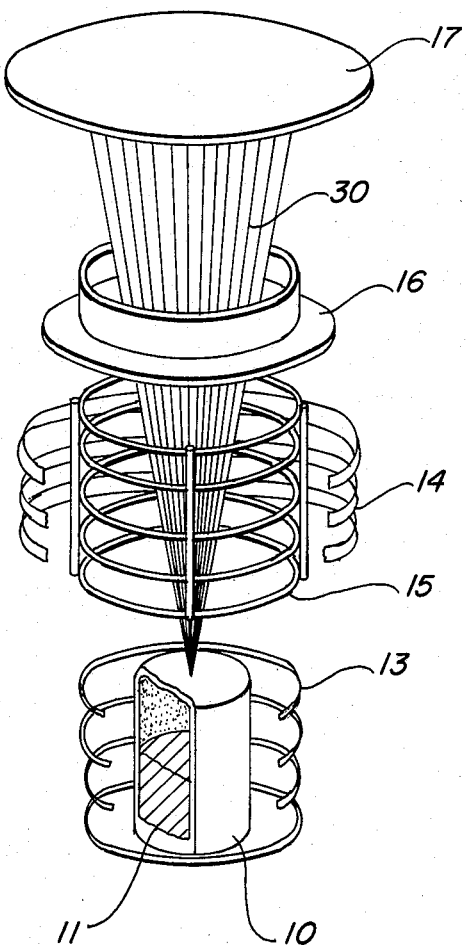
FIG. 3 is a perspective analytical view showing a main section of the equipment of FIG. 2.

FIG. 2 is a schematic cross-sectional view showing equipment for use in carrying out a method of an embodiment of the present invention, and FIG. 3 is a perspective view showing the inside of a main section of the equipment of FIG. 2. In FIG. 2 there are provided a closed crucible 10 for containing a material 11, a nozzle 12 through which a vapor is ejected, a heating filament 13 surrounding the crucible 10, and an ionizing filament 14 for dissipating electrons 33 for ionizing the vapor ejected through the nozzle 12. In addition, there are provided electrodes 15 for dispelling electrons from the ionizing filaments 14, accelerator electrodes 16 for accelerating the ions obtained to enable the same to reach a substrate 17, and an oxygen gas inlet 19 for introducing an oxygen gas into a vacuum container 18. The reference numeral 20 designates a pressure reduction valve used while introducing an oxygen gas into the vacuum container 18 from an oxygen gas container 21. The reference numeral 23 designates a main valve for evacuating air from the container 18, which valve is located in a duct 22 connected to an air discharge device (not shown). The reference numeral 24 designates insulating pillars which support a heat radiating plate 25. The reference numeral 26 designates a support for connecting the crucible 10 to the insulating pillars 24. A heater 27 is provided to heat the substrate 17 to an optimum temperature, which heater is fixed to the vacuum container 18 by means of a fixing member 28. The heat radiating plate 25 and the accelerating electrodes 16 are connected to each other through a cylindrical insulating member 24.

In operation, a silicon dioxide powder 11 is packed in the crucible 10, which is then heated by the heating filament 13 at not lower than 1,600° C. The packed material 11 in the crucible 10 is vaporized, and most of it dissolves into silicon monoxide and oxygen. The vapor is ejected through the nozzle 12 into the gas ambient in the vacuum container 18, thereby producing atomic clusters 29. Then, the cluster beams 30 ejected through the nozzle 12 are partially ionized by the electrons radiated from the ionizing filaments 14. The resulting ions are accelerated by the accelerating electrodes 16, and collide with the substrate 17 together with neutral particles thereby to be vapor-plated thereon. The vapor-plating rate is 1Å/sec, and the partial pressure of oxygen in the vacuum container 18 is about $1 \times 10^{-2}$Pa. In other words, the silicon dioxide is heated in the crucible 10, and dissolved in the course of evaporating at the elevated temperature, which causes the shortage of oxygen. Therefore, oxygen is introduced through the inlet 19 so as to cause it to react with the ionized vapor. In this way a high quality silicon dioxide film 31 is produced.

In this example not only the ejected vapor but also part of the oxygen contained in the ambient gas is ionized. This ionized oxygen is also effective for producing the superior silicon dioxide films.

Figure 4:
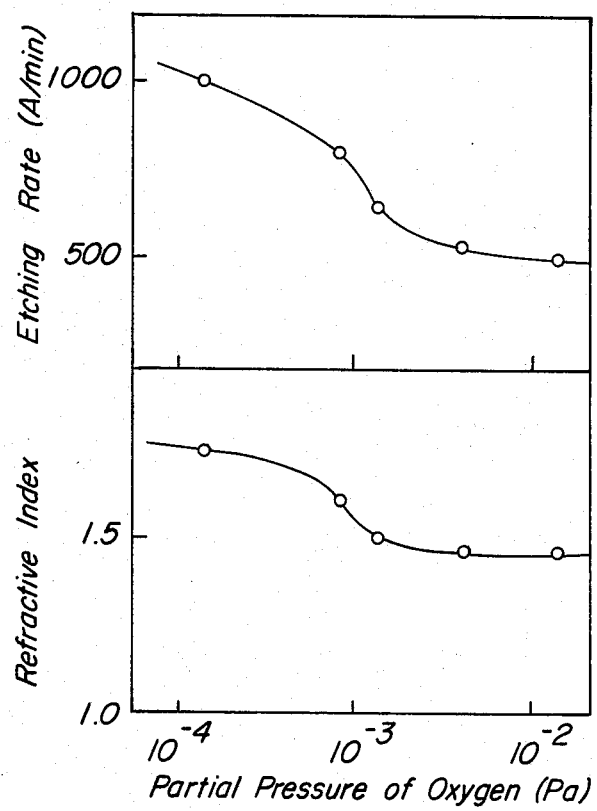
FIGS. 4 and 5 are graphs showing the characteristics of silicon dioxide films produced under the conventional method and the method of the present invention for comparison.

FIG. 4 shows the results obtained by measuring the etching rate and the refractive index of the silicon dioxide films produced by changing the partial pressure of oxygen. In this case, the temperature of the crucible was 1,600° C., the electron current for ionizing was 100mA, the accelerating voltage was 0KV, the vapor-plating rate was 1Å/sec, and the temperature of the substrate was 200° C. The silicon dioxide film obtained had a thickness of 3,000Å. As evident from FIG. 4, as the partial pressure of oxygen increases, the etching rate becomes low. It will be understood from this fact that close-textured films are produced. In measuring the etching rate a fluoric acid solution was used. It will also be appreciated that as the partial pressure of oxygen increases, the refractive index reaches 1.46, which is a value of silicon dioxide in bulk.

Figure 5:
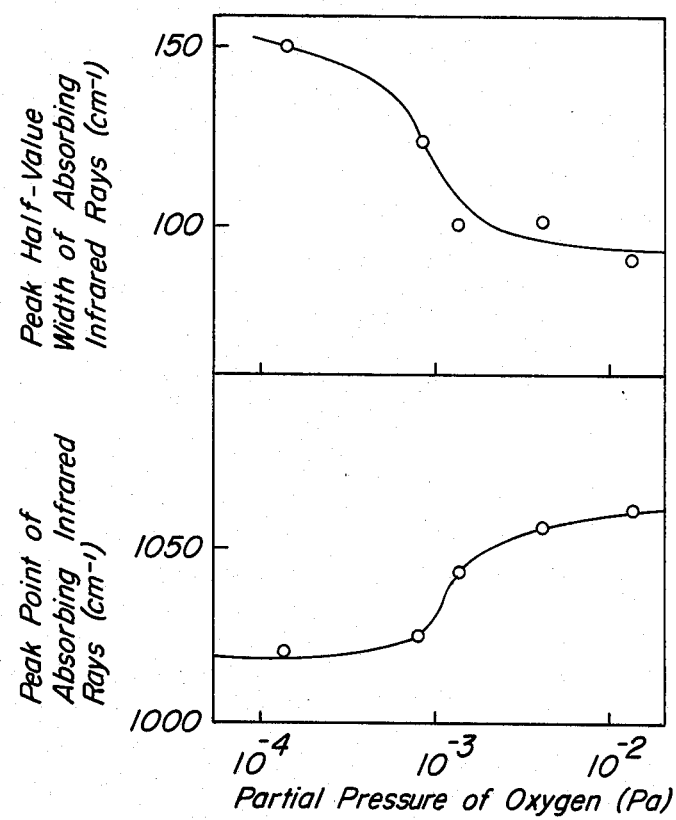

FIG. 5 shows the results obtained by an infrared ray analysis on the silicon dioxide films produced by changing the partial pressure of oxygen. The conditions for conducting the experiment were the same as in the case of FIG. 4. It will be understood from FIG. 5 that as the partial pressure increases, the peak point of absorbing infrared rays gradually shifts to the low wavelength side, and the half-value width diminishes. This data process that the silicon is strongly united with the oxygen.

The comparative data with respect to silicon dioxide films obtained by the present invention, the conventional sputtering, and the conventional CVD method are shown in the following table:

| | Method of Invention | Sputtering Method | CVD Method |
|---|---|---|---|
| Peak Point of Absorbing Infrared Rays [cm$^{-1}$] | 1060 to 1070 | 1060 or less | 1060 or less |
| Peak Half-Value Width of Absorbing Infrared Rays [cm$^{-1}$] | 80 to 90 | 90 to 100 | 100 to 200 |
| Refractive Index | 1.46 | 1.46 | 1.47 |
| Etching Rate [Å/min] | 540 | 800 | 5000 to 7000 |
| Vapor-Plating Rate [Å/min] | 60 to 300 | 100 | 3000 |
| Temperature of Substrate [°C.] | 200 or less | 200 to 400 | 450 |

The partial pressure of oxygen in the vacuum container in the method of the present invention was $1.3 \times 10^{-2}$Pa. As evident from the Table, the silicon dioxide films produced under the present invention have the peak point of absorbing infrared rays located toward the low wavelength side, and a relatively low half-value width, from which it is understood that the silicon is well combined with the oxygen. In addition, the etching rate exhibits a small value, from which it is understood that close-textured films are obtained.

Under the present invention a complete oxidation is carried out, and it is possible to control the temperatures of the substrate 17 at a relatively low temperature below 400° C., which is sufficient to secure full diffusion of oxygen and silicon atoms on the surface of the substrate thereby to unite with each other. In this way good quality silicon dioxide films are obtained at a relatively low temperature, and such high quality films are suitable for use as insulating films in semiconductor elements.

In the illustrated embodiment the material 11 was silicon dioxide, but it is not limited thereto but can be silicon or silicon monoxide or any other silicon oxides. It can be used alone or in combination.

In the illustrated embodiment an oxygen gas was introduced into the vacuum container 18, but ozone or any other gas consisting mainly of oxygen can be effectively used.

Figure 6:
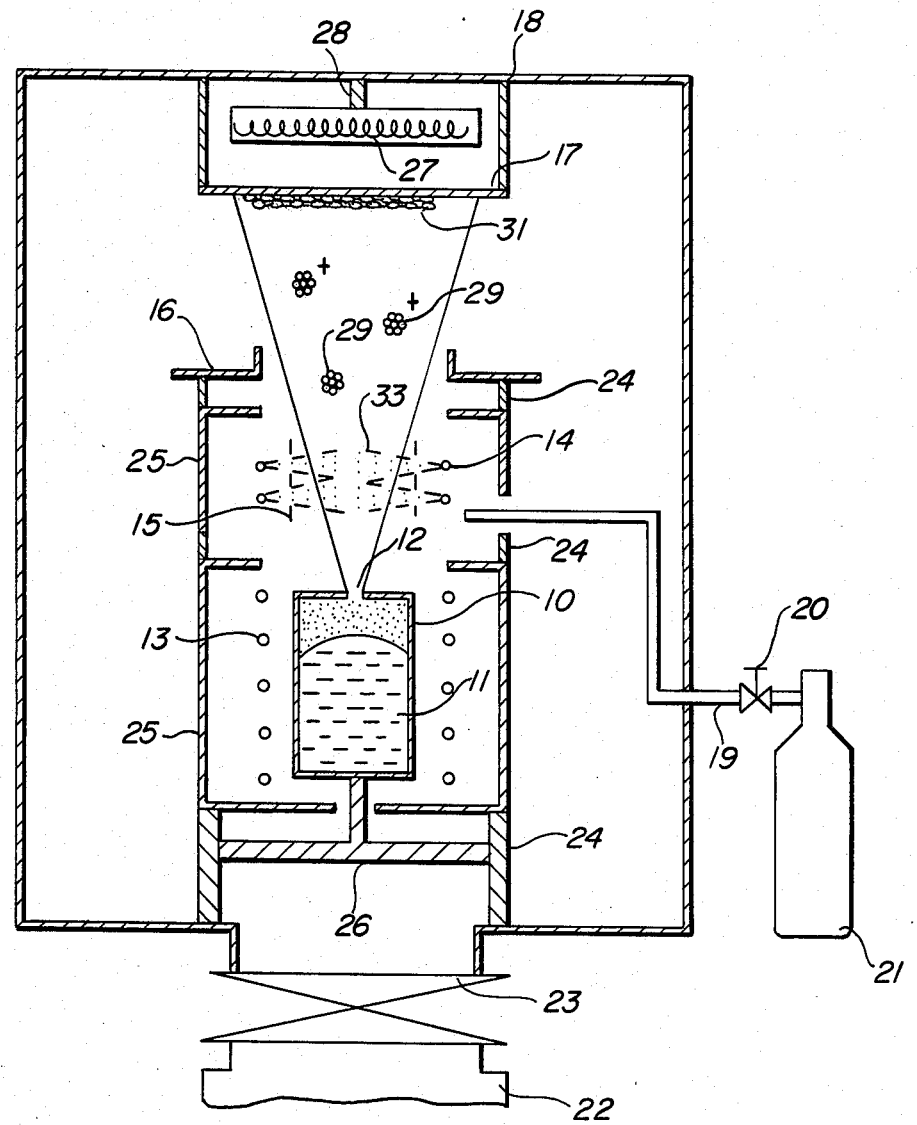
FIG. 6 and 7 are schematic cross-sectional views showing modified equipment for carrying out the methods of other embodiments of the present invention.
Figure 7:
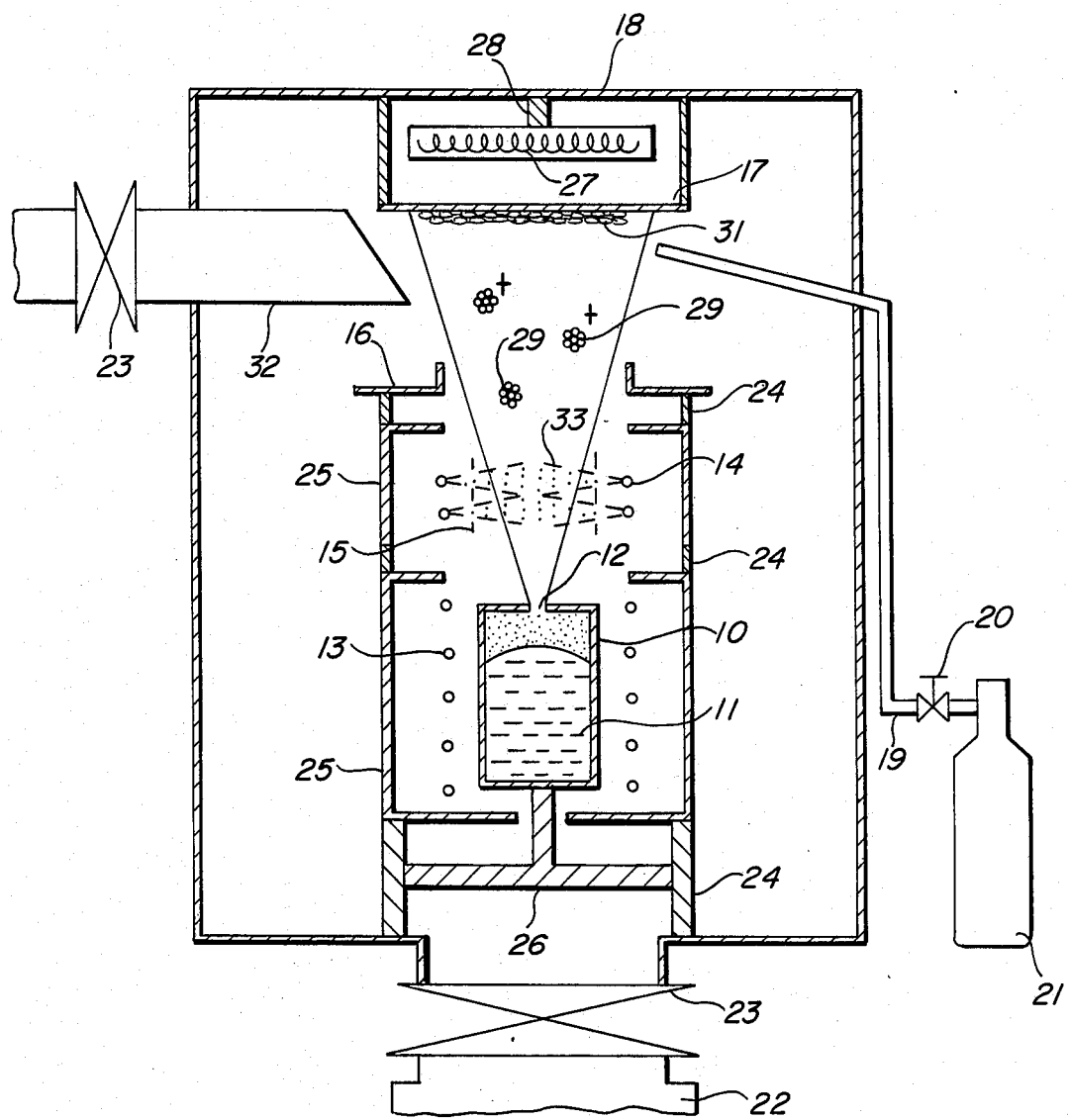

In the illustrated embodiment the partial pressure of oxygen was made uniform in the vacuum container 18 by introducing an oxygen gas through the inlet 19. As shown in FIG. 6, it is also possible to modify so that the partial pressure of oxygen only around the ionizing filaments 14 is raised, or alternatively, as shown in FIG. 7 the one only around the substrate 17 is raised. These modifications have produced the same effects as under the first embodiment.

In the embodiment illustrated in FIG. 6 the oxygen gas inlet 19 is extended up to the ionizing filaments 14 inside the heat radiating plates.

In the embodiment illustrated in FIG. 7 the oxygen gas inlet 19 is extended to reach the upper portion of the vacuum container 18, that is, a point near the substrate 17, and an additional discharge duct 32 is provided so as to exhaust mainly the oxygen to the outside therethrough.

In the first embodiment a part of the introduced gas is ionized, excited or dissolved at the same place as the material vapor, but it is possible to ionize, excite or dissolve the introduced gas around the inlet port by applying electrons, light, X-rays or gamma-rays to it. The same effects will be obtained.

In the first embodiment, when the vapor-plating rate was 1Å/sec, the partial pressure of oxygen in the ambient was set to $1 \times 10^{-2}$Pa such that the number of oxygen atoms colliding with the substrate 17 amounts to 10 times or more that of silicon atoms colliding therewith. However, it is possible to reduce the number of oxygen atoms colliding with the substrate 17 to the number of silicon atoms by ionizing, exciting or dissolving the oxygen atoms or molecules in an efficient manner.

As evident from the foregoing description, according to the present invention there is provided a method of producing a high quality silicon dioxide film, which method comprises a first step of heating silicon or silicon oxides to vaporize the same; a second step of ionizing the vaporized material; and a third step of accelerating the ionized material so as to collide with the substrate, wherein the three steps are conducted in a gas ambient consisting mainly of oxygen atoms, thereby enabling silicon dioxide to be vapor-plated on the substrate.

We claim:

1. A method of producing silicon dioxide films comprising:
    a first step of heating a material comprising silicon or silicon oxides to vaporize said material;
    a second step of ionizing or exciting said vaporized material; and
    a third step of accelerating the ionized material so that it collides with the surface of a substrate;
    conducting said first, second and third steps in a vacuum container having an ambient gas consisting mainly of oxygen atoms to thereby enable silicon dioxide to be vapor-plated on the substrate to a predetermined thickness.

2. A method of producing silicon dioxide films as defined in claim 1, wherein said first step comprises:
    packing said material in a closed container having a nozzle;
    heating said closed container; and
    ejecting said heated material from said nozzle in a vapor form.

3. A method of producing silicon dioxide films as defined in claim 1, wherein said ambient gas in said vacuum container is produced by introducing an oxygen or ozone gas therein.

4. A method of producing silicon dioxide films as defined in claim 1, further comprising a fourth step of ionizing, exciting or dissolving at least part of said ambient gas in said vacuum container, thereby enabling the ionized, excited or dissolved ambient gas to react with said material.

5. A method of producing silicon dioxide films as defined in claim 3, wherein said oxygen or ozone introduced into said vacuum container reacts with said material near the surface of said substrate.

6. A method of producing silicon dioxide films as defined in claim 3, wherein said oxygen or ozone introduced into said vacuum container reacts with said material near ionizing filaments.

7. A method of producing silicon dioxide films as defined in claim 4, wherein said ionized, excited or dissolved ambient gas reacts with said material near the surface of said substrate.

8. A method of producing silicon dioxide films as defined in claim 1, wherein the partial pressure of oxygen in said vacuum container is predetermined such that the number of oxygen atoms colliding with said substrate is not smaller than the number of silicon atoms colliding with said substrate.

9. A method of producing silicon dioxide films as defined in claim 1, wherein said silicon oxides are selected from silicon monoxide or silicon dioxide.

10. A method of producing silicon dioxide films as defined in claim 2, wherein said ambient gas in said vacuum container is produced by introducing an oxygen or ozone gas therein.

11. A method of producing silicon dioxide films as defined in claim 2, further comprising a fourth step of ionizing, exciting or dissolving at least part of said ambient gas in said vacuum container, thereby enabling the ionized, excited or dissolved ambient gas to react with said material.

12. A method of producing silicon dioxide films as defined in claim 3, further comprising a fourth step of ionizing, exciting or dissolving at least part of said ambient gas in said vacuum container, thereby enabling the ionized, excited or dissolved ambient gas to react with said material.

13. A method of producing silicon dioxide films as defined in claim 2, wherein the partial pressure of oxygen in said vacuum container is predetermined such that the number of oxygen atoms colliding with said substrate is not smaller.than the number of silicon atoms colliding with said substrate.

14. A method of producing silicon dioxide films as defined in claim 3, wherein the partial pressure of oxygen in said vacuum container is predetermined such that the number of oxygem atoms colliding with said substrate is not smaller than the number of silicon atoms colliding with said substrate.

15. A method of producing silicon dioxide films as defined in claim 4, wherein the partial pressure of oxygen in said vacuum container is predetermined such that the number of oxygen atoms colliding with said substrate is not smaller than the number of silicon atoms colliding with said substrate.

16. A method of producing silicon dioxide films as defined in claim 5, wherein the partial pressure of oxygen in said vacuum container is predetermined such that the number of oxygen atoms colliding with said substrate is not smaller than the number of silicon atoms colliding with said substrate.

17. A method of producing silicon dioxide films as defined in claim 6, wherein the partial pressure of oxygen in said vacuum container is predetermined such that the number of oxygen atoms colliding with said substrate is not smaller than the number of silicon atoms colliding with said substrate.

18. A method of producing silicon dioxide films as defined in claim 7, wherein the partial pressure of oxygen in said vacuum container is predetermined such that the number of oxygen atoms colliding with said substrate is not smaller than the number of silicon atoms colliding with said substrate.

19. A method of producing silicon dioxide films as defined in claim 8, wherein said silicon oxides are selected from silicon monoxide or silicon dioxide.

20. A method of producing silicon dioxide films as defined in claim 9, wheeein the partial pressure of oxygen in said vacuum container is predetermined such that the number of oxygen atoms colliding with said substrate is not smaller than the number of silicon atoms colliding with said substrate.

21. A method of producing silicon dioxide films as defined in claim 2, wherein said silicon oxides are selected from silicon monoxide or silicon dioxide.

22. A method of producing silicon dioxide films as defined in claim 3, wherein said silicon oxides are selected from silicon monoxide or silicon dioxide.

23. A method of producing silicon dioxide films as defined in claim 4, wherein said silicon oxides are selected from silicon monoxide or silicon dioxide.

24. A method of producing silicon dioxide films as defined in claim 5, wherein said silicon oxides are selected from silicon monoxide or silicon dioxide.

25. A method of producing silicon dioxide films as defined in claim 6, whereih said silicon oxides are selected from silicon monoxide or silicon dioxide.

26. A method of producing silicon dioxide films as defined in claim 7, where n said silicon oxides are selected from silicon monoxide or silicon dioxide.

27. A method of producing a silicon dioxide film comprising:
   positioning a substrate in a vacuum container with an ambient gas consisting mainly of oxygen atoms;
   heating a material comprising silicon or silicon oxides to vaporize said material;
   ionizing said vaporized material; and
   accelerating said ionized material so that is collides with the surface of said substrate to thereby vaporplate said substrate to form said silicon dioxide film.

* * * * *